(12) United States Patent
Cheng et al.

(10) Patent No.: US 6,579,106 B1
(45) Date of Patent: Jun. 17, 2003

(54) ELECTRICAL CONNECTING STRUCTURE OF A TAPE CARRIER PACKAGE FOR A LCD DRIVER

(75) Inventors: Yi-Ming Cheng, Hsin-Chu (TW); Kun-Che Chen, Hsin-Chu (TW); Jih-Huang Huang, Hsin-Chu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/104,006

(22) Filed: Mar. 25, 2002

(51) Int. Cl.⁷ .............................................. H01R 9/09
(52) U.S. Cl. ...................................................... 439/66
(58) Field of Search .............................. 439/66, 67, 70; 349/149, 150, 58; 361/400

(56) References Cited

U.S. PATENT DOCUMENTS 3,638,163 A * 1/1972 Loosme ........................ 439/74
5,171,290 A * 12/1992 Olla et al. .................... 439/71

* cited by examiner

*Primary Examiner*—Lynn Feild
*Assistant Examiner*—Phuong K T Dinh
(74) *Attorney, Agent, or Firm*—Rosenberg, Klein & Lee (57) ABSTRACT

An electrical connecting structure of a tape carrier package for a LCD driver is provided. The present electrical connecting structure comprises a circuit board having a plurality of conductive terminals, a conductive member having a plurality of rows of conductive portions formed thereon and a tape carrier package of a LCD driver having a plurality of input/output leads. The conductive member is disposed between the circuit board and the tape carrier package. The pitch of the conductive portions is smaller than that of the conductive terminals and that of the input/output leads such that the conductive portions can electrically connect the conductive terminals to the input/output leads. The present electrical connecting structure also can be provided in a mounting structure of a LCD driver tape carrier package with a circuit board for advantageously performing failure analysis.

19 Claims, 7 Drawing Sheets

ELECTRICAL CONNECTING STRUCTURE OF A TAPE CARRIER PACKAGE FOR A LCD DRIVER

BACKGROUND OF THE INVENTION

1. Field of the Invention

The present invention relates to an electrical connecting structure between two circuit boards, and more particularly, to an electrical connecting structure suitable for a mounting structure of a tape carrier package (TCP) with a circuit board.

2. Description of the Prior Art

Figure 1:
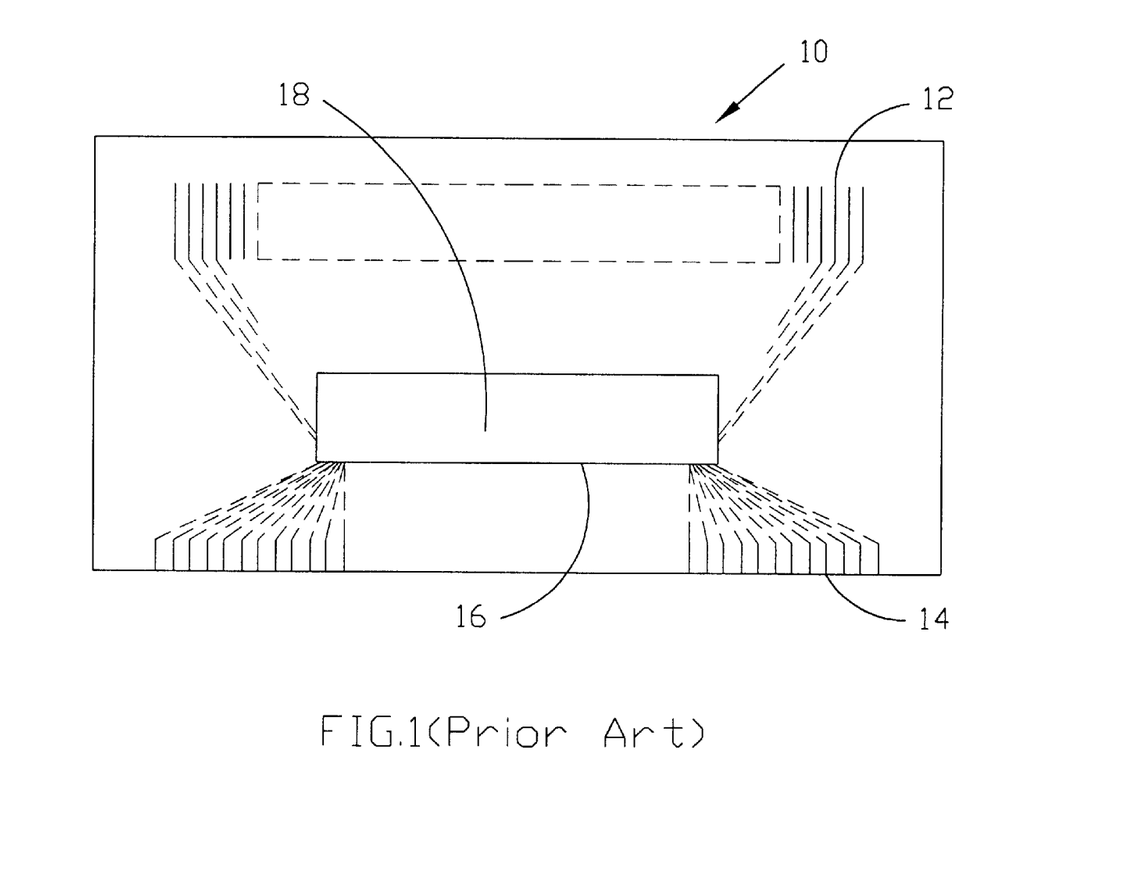
FIG. 1 is a schematic view of a conventional LCD driver tape carrier package.

A liquid crystal display (LCD) uses TAB (tape-automated bonding) tape carrier as a means of connecting its printed circuit board to the electrodes on the glass board of its liquid crystal panel. A LCD driver chip is mounted on the TAB tape carrier. FIG. 1 shows a conventional LCD driver tape carrier package 10 using TAB technology. The TAB tape carrier 10 has an insulating film tape 11 formed of a polyimide layer, input leads 12 and output leads 14 laid on its surface. The TAB tape carrier 10 has a chip mounting opening 16, which provides a chip mounting site. The input leads 12 extending from the chip mounting opening 16 toward one edge of the TAB tape carrier 10. The output leads 14 extend from the chip mounting opening 16 toward the other edge of the TAB tape carrier 10. A LCD driver chip 18 is connected to the input leads 12 and output leads 14 in the position of the chip mounting opening 16. In this manner, a LCD driver tape carrier package is formed.

After the LCD driver chip 18 is mounted on the insulating film tape 11, a test may be carried out to inspect whether the mounting condition (interconnecting condition) is satisfactory. Traditionally, the LCD driver tape carrier package 10 is placed on a probe card mounted on a probe station. Probe pins are brought into contact with the input leads 12/or output leads 14 of the LCD driver tape carrier package 10, to inspect whether the LCD driver chip 18 is satisfactorily connected to the input leads 12/or output leads 14. For this conventional test method, the alignments of the probe pins with the input leads 12/or output leads 14 are manually operated, which is inconvenient and time-consuming. When the test method is repetitiously performed, the input leads 12/or output leads 14 are easily damaged by the probe pins. Moreover, it is necessary to use the probe station and probe card for this conventional test method. The probe card is expensive with a cost about NT$20,000 per card, and needs to be maintained periodically. Therefore, this conventional test method is uneconomical and inconvenient.

Accordingly, it is desirable to develop an implement, which facilitates the failure analysis for the LCD driver tape carrier package without the above drawbacks.

SUMMARY OF THE INVENTION

It is one objective of the present invention to provide an electrically connecting structure of a tape carrier package for a LCD driver, which utilizes an interface disposed between the tape carrier package and a circuit board for improving electrical contact thereof.

It is another objective of the present invention to provide an electrical connecting structure of a tape carrier package for a LCD driver, which facilitates failure analysis thereof.

It is a further objective of the present invention to provide a mounting structure for a LCD driver tape carrier package with a print circuit board, which can repetitiously perform failure analysis without damaging the LCD driver tape carrier package.

It is still further objective of the present invention to provide a mounting structure for a LCD driver tape carrier package with a print circuit board, which is easily assembled with low cost and provides mechanical stability.

In order to achieve the above objectives of this invention, the present invention provides an electrical connecting structure of a tape carrier package for a LCD (liquid crystal display) driver and mounting structure of a tape carrier package with a circuit board using the same. The present electrical connecting structure comprises a circuit board having a plurality of conductive terminals, a conductive member having a plurality of rows of conductive portions formed thereon and a tape carrier package of a LCD driver having a plurality of input leads and a plurality of output leads. The conductive member is disposed between the circuit board and the tape carrier package. The pitch of the conductive portions is smaller than that of the conductive terminals, the input leads and the output leads such that the conductive portions can electrically connect the conductive terminals to the output leads. The present mounting structure of a tape carrier package with a circuit board comprises a circuit board, a holding plate, a conductive member, a tape carrier package for a LCD driver and a base plate. The circuit board includes a plurality of conductive terminals formed on a surface and a first opening formed along one side of the circuit board and adjacent to the conductive terminals. The holding plate is disposed under the surface of the circuit board having the conductive terminals formed thereon. The holding plate has a second opening matched with the first opening and a slot formed in a position thereof corresponding to the conductive terminals. The conductive member is disposed in the slot of the holding plate. The conductive member has a plurality of conductive portions formed thereon for electrically connecting with the respective conductive terminals. The pitch of the conductive portions is smaller than that of the conductive terminals. The tape carrier package for a LCD driver is disposed under the holding plate. The tape carrier package includes a tape carrier and an LCD driver chip. The tape carrier comprises a chip mounting site for mounting the LCD driver chip, a plurality of input leads formed along one side of the taper carrier far from the chip mounting site, and a plurality of output leads formed along the other side thereof near the chip mounting site and corresponding with the slot of the holding plate. The pitch of the output leads is larger than that of the conductive portions of the conductive member so that each output lead is able to electrically connect with one conductive terminal of the circuit board through the conductive portions. The base plate is used for supporting the tape carrier package. The base plate has a recess portion for placing the tape carrier package therein. Since the output leads of the tape carrier package for the LCD driver can electrically connect with conductive terminals of the circuit board through the conductive portions of the conductive member, the output leads can electrically couple to external terminals via the circuit board. As a result, the present mounting structure of a LCD driver tape carrier package with a circuit board can advantageously and repetitiously perform failure analysis via the circuit board without damaging the output leads of the LCD driver tape carrier package.

BRIEF DESCRIPTION OF THE DRAWINGS

The objectives and features of the present invention as well as advantages thereof will become apparent from the following detailed description, considered in conjunction with the accompanying drawings.

DESCRIPTION OF THE EMBODIMENTS

The connecting structure for providing electrical connection between two circuit boards, more specifically an electrical connecting structure of a tape carrier package for a LCD driver, and a mounting structure of a tape carrier package (TCP) for a LCD driver with a circuit board using the connecting structure, provided by the present invention, will be described in detail according to the following preferred embodiments with reference to accompanying drawings.

Figure 2:
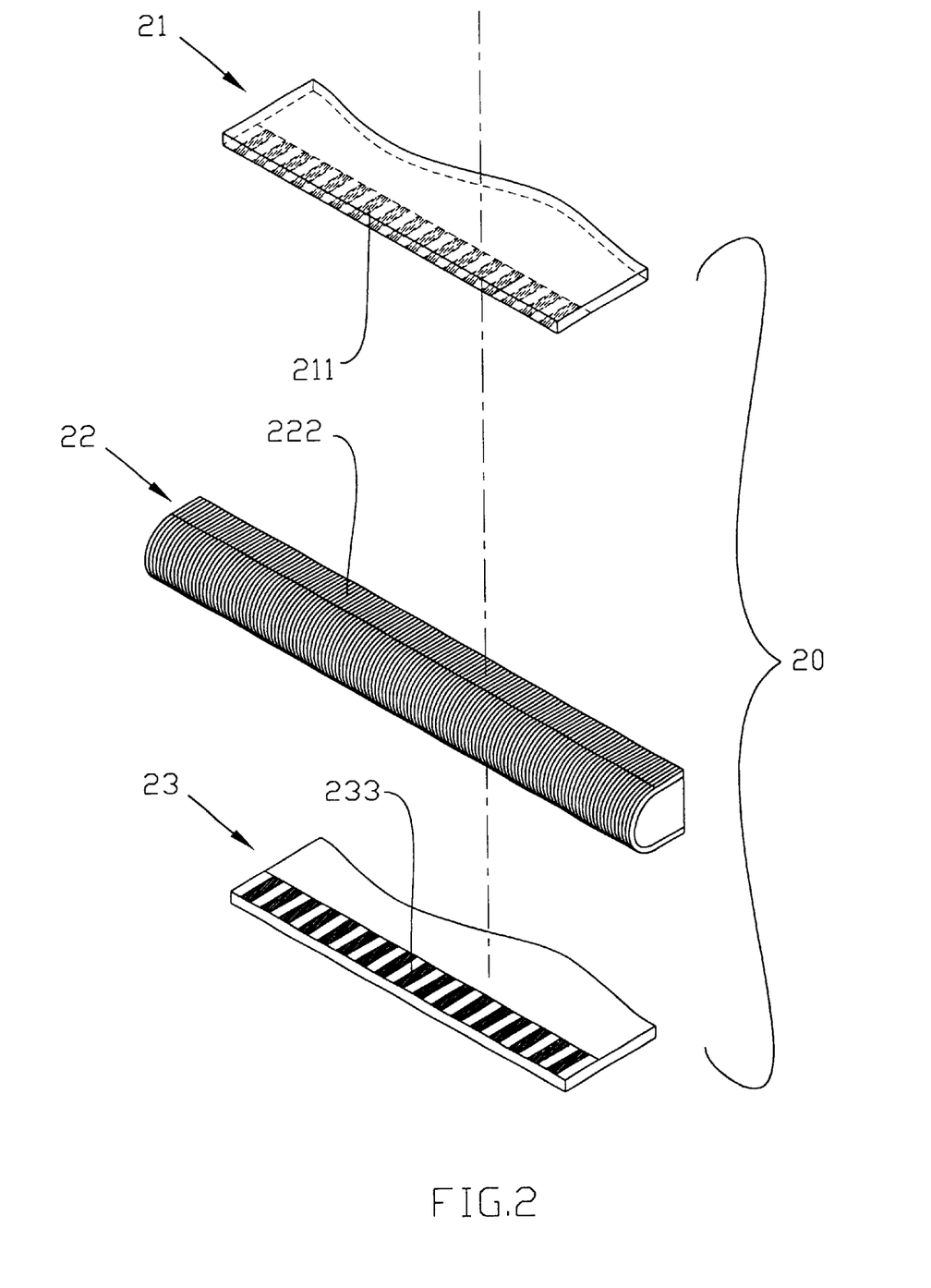
FIG. 2 is a partly enlarged exploded schematic view of a connecting structure according to one preferred embodiment of the present invention.

FIG. 2 is a partly enlarged exploded schematic view of the connecting structure 20 for providing electrical connection between two circuit boards according to one preferred embodiment of the present invention. The connecting structure 20 comprises a first circuit board 21 having a plurality of first conductive terminals 211, a conductive member 22 having a plurality of rows of conductive portions 222 formed thereon and a second circuit board 23 having a plurality of second conductive terminals 233. The conductive member 22 is disposed between the surface of the first circuit board 21 having the first conductive terminals 211 formed thereon and the surface of the second circuit board 23 having the second conductive terminals 233 formed thereon. The longitudinal dimension of the conductive portions 222 is longer than that of the first conductive terminals 211 and that of the second conductive terminals 233. And, the pitch of the conductive potions 222 is smaller than that of the first conductive terminals 211 and that of the second conductive terminals 233. Therefore, the conductive portions 222 of the conductive member 22 are capable of electrically connecting the first conductive terminals 211 to the second conductive terminals 233. And hence, the conductive member 22 electrically contacts with the first circuit board 21 and the second circuit board 23, and providing electrical connection between them.

Preferably, the conductive member 22 is formed of a flexible member having a plurality of conductive filaments formed thereon. With this arrangement, the conductive member 22 elastically deforms in response to a pressure applied to the first circuit board 21 and the second circuit board 23, and the elastic force increases the contact pressure of a contacted portion. Hence, the conductive portions 222, the first conductive terminals 211 and the second conductive terminals 233 can be brought into closer contact with resultant improved contact reliability.

Figure 3A:
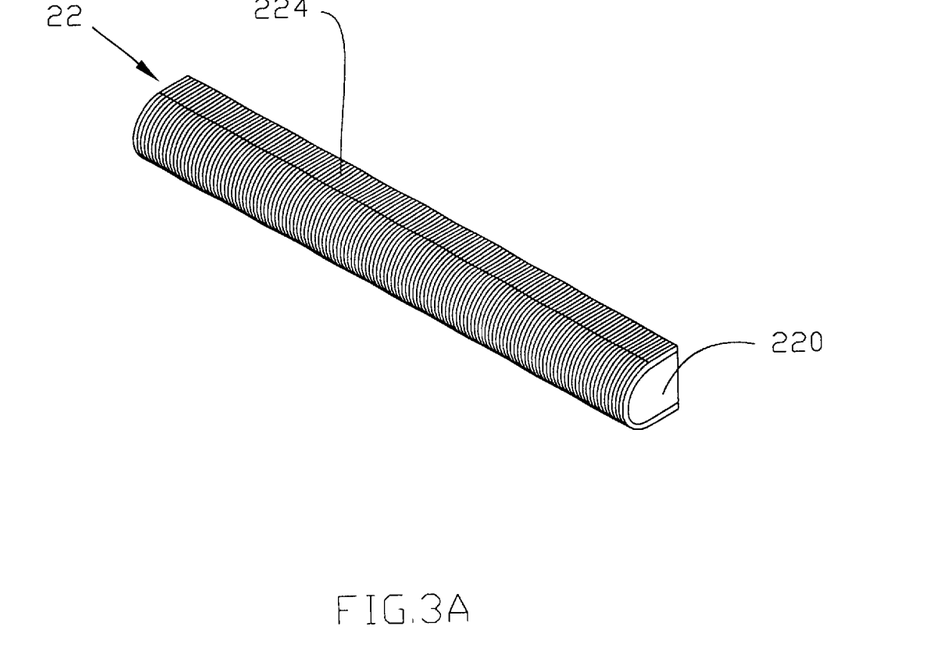
FIG. 3A is a perspective view of a conductive member of the connecting structure of FIG. 2.
Figure 3B:
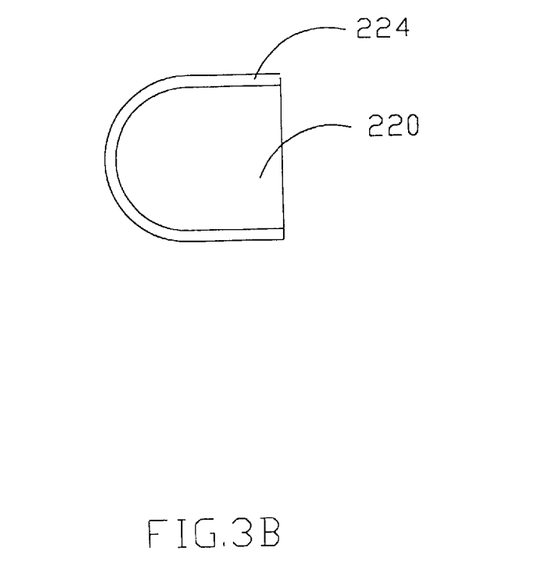
FIG. 3B is a cross sectional view of the conductive member of FIG. 3A.
Figure 3C:
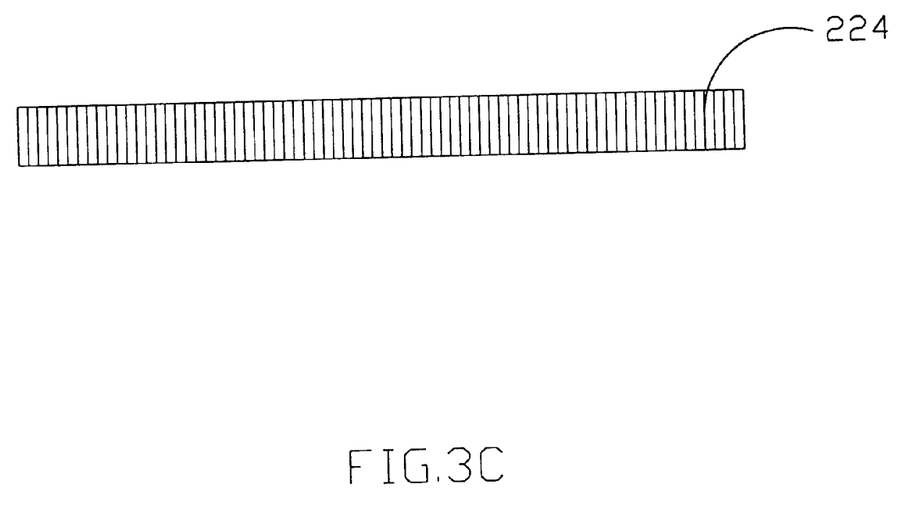
FIG. 3C is a top view of the conductive member of FIG. 3A.

Referring to FIG. 3A, the conductive member 22 is most preferably a flexible strip formed of silicon rubber 220 having gold-plated filaments 224 formed thereon. FIG. 3B is a cross sectional view of the flexible strip of silicon rubber 220 having gold-plated filaments 224 formed thereon, FIG. 3C is an enlarged top view of the flexible strip. The pitch between the gold-plated filaments 224 is preferably about 0.03 mm.

In the connecting structure 20, the first circuit board 21 can be a print circuit board and the first conductive terminals 211 can be the input/output terminals of the print circuit board. The second circuit board 23 can be a flexible wiring board, such as a tape carrier package having a plurality of input leads and a plurality of output leads formed thereon.

Alternately, the connecting structure 20 can be a plane structure instead of the layered structure of FIG. 2. The conductive member 22 is served as an interface for providing improved electrical contact between the first circuit board 21 and the second board 23. Under this circumstance, good electrical connection between the first circuit board 21 and the second circuit board 23 is obtained via the conductive member 22 even though both of them are not in alignment with each other.

Figure 4:
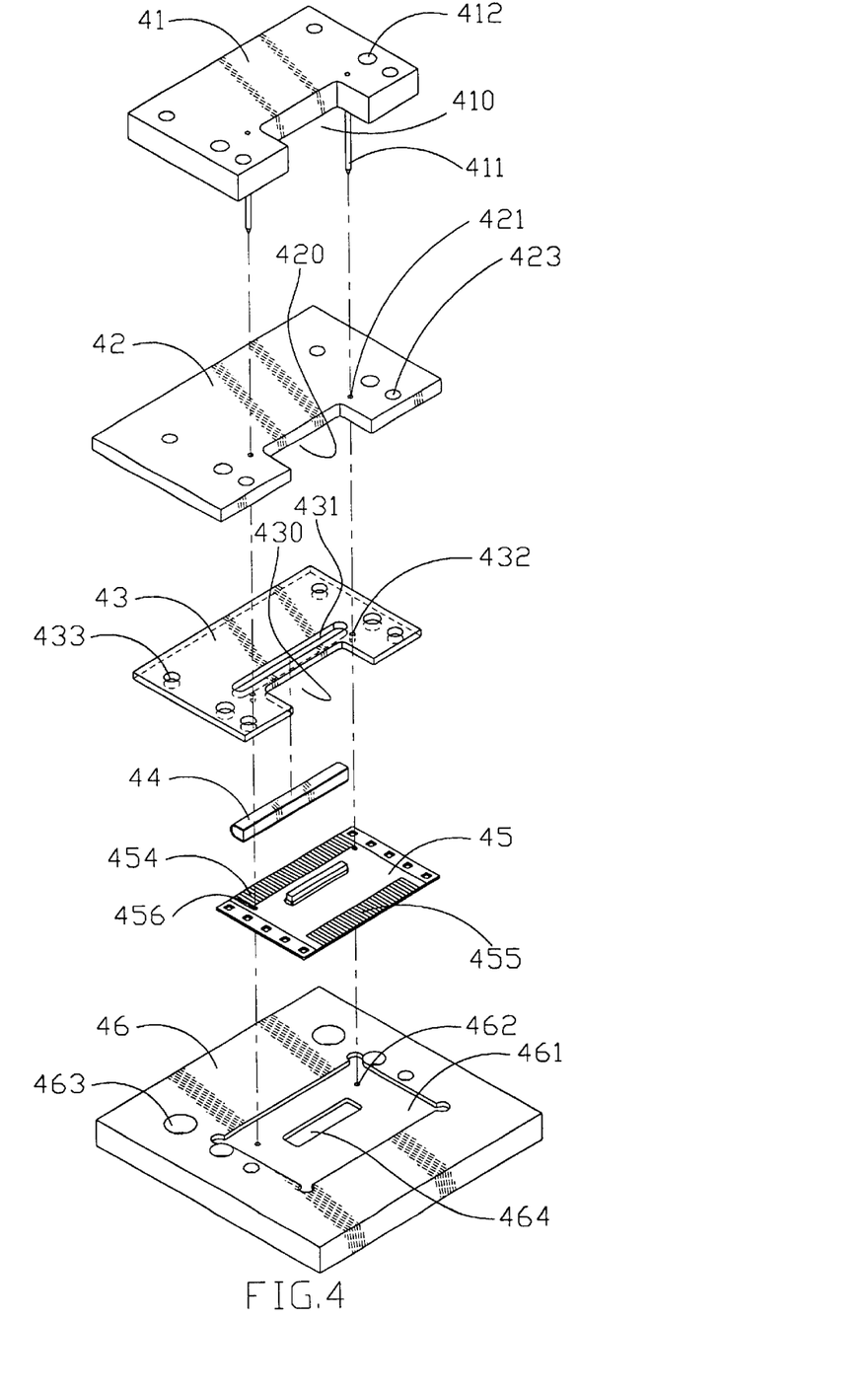
FIG. 4 is an exploded perspective view of a mounting structure of a LCD driver tape carrier package with a circuit board according to another preferred embodiment of the present invention.
Figure 5:
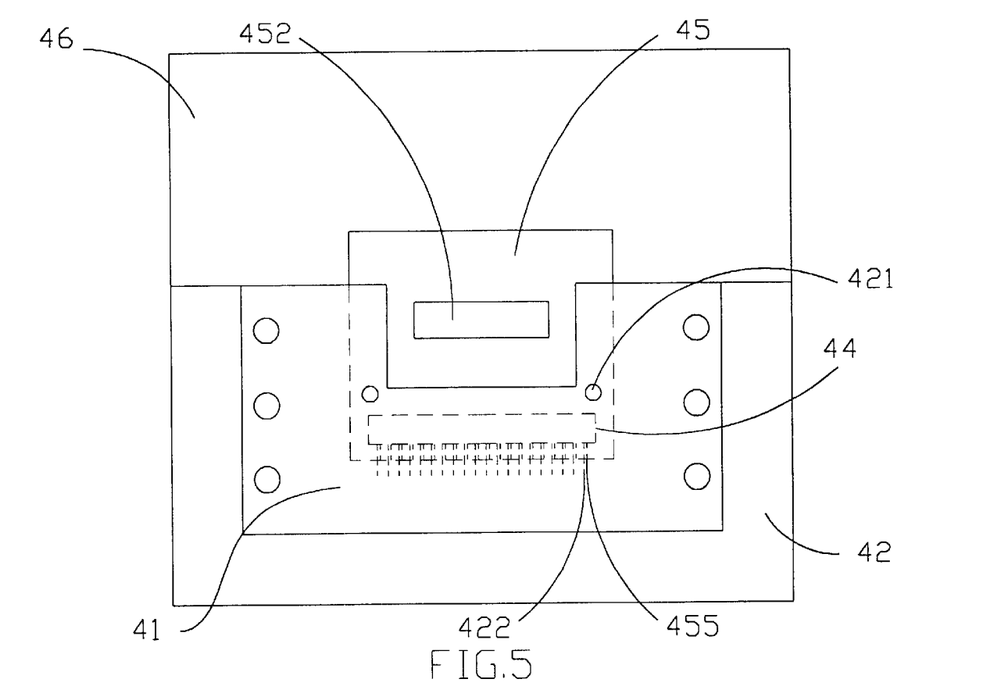
FIG. 5 is a top view of the mounting structure of FIG. 4.

On the other hand, the connecting structure 20, for providing electrical connection between two circuit boards, can be employed in a mounting structure of a LCD driver tap carrier package with a print circuit board provided by the present invention. FIG. 4 is an exploded perspective view of the mounting structure 40 according to another preferred embodiment of the present invention, and FIG. 5 is a top view of the mounting structure 40.

Referring to FIG. 4, the mounting structure 20 of a LCD driver tape carrier package with a print circuit board comprises an upper plate 41, a print circuit board 42, a holding plate 43, a conductive member 44, a tape carrier package 45 for a LCD driver package and a base plate 46. The upper plate 41 includes a first opening 410 formed on one side thereof, at least one pair of guide pieces 411 on opposite sides of the first opening 410 and outwardly extending from a surface of the upper plate 41, and a plurality of first through holes 412 on opposite sides of the first opening 410 separately from the pair of guide pieces 411.

Figure 7:
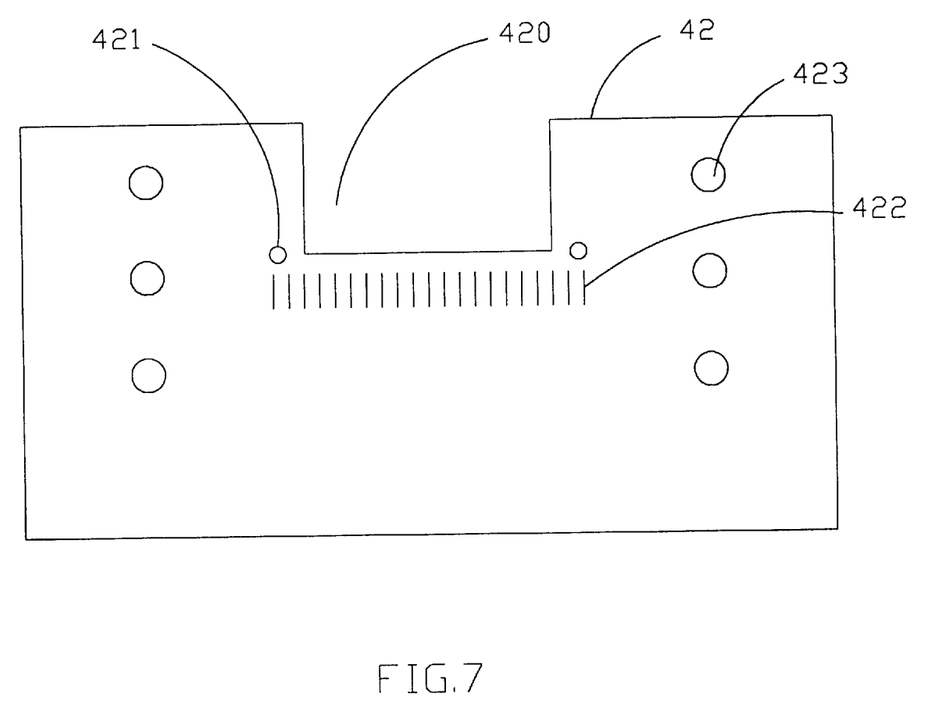
FIG. 7 is a bottom view of a print circuit board of the mounting structure of FIG. 4.

The print circuit board 42 is disposed under the surface of the upper plate 41 having the guide pieces 411. FIG. 7 is a schematic bottom view of the print circuit board 42. The print circuit board 42 includes a second opening 420 formed on one side thereof and matched with the first opening 410, at least one pair of first guide holes 421 for receiving the guide pieces 411, a plurality of conductive terminals 422 along one side of the second opening 420 between the first guide holes 421 and on the surface of the print circuit board 42 not contacting with the upper plate 41, and a plurality of second through holes 423 on opposite sides of the second opening 420 separately from the first guide holes 421 and in alignment with the first through holes 412 of the upper plate 41. The pitch of the conductive terminals 422 is about 0.3 mm.

The holding plate 43 is disposed under the surface of the print circuit board 42 having the conductive terminals 422 formed thereon. The holding plate 43 includes a third opening 430 matched with the second opening 420, a slot 431 formed in a position thereof corresponding to the conductive terminals 422, at least one pair of second guide holes 432 on opposite sides of the third opening 430 for receiving the guide pieces 411, and a plurality of third through holes 433 on opposite sides of the third opening 430 separately from the second guide holes 432 and in alignment with the second through holes 423.

The conductive member 44 is disposed in the slot 431 of the holding plate 43. The conductive member 44 has a plurality of conductive portions (not shown) formed thereon for electrically connecting with the respective conductive terminals 422 of the print circuit board 42. The pitch of the conductive portions is smaller than that of the conductive terminals 422. The conductive member 44 can be a flexible member having conductive filaments formed thereon. Referring to FIG. 3A, the conductive member 44 is preferably a flexible strip formed of silicon rubber having gold-plated filaments formed thereon. The pitch of the gold-plated filaments is about 0.03 mm.

Figure 6:
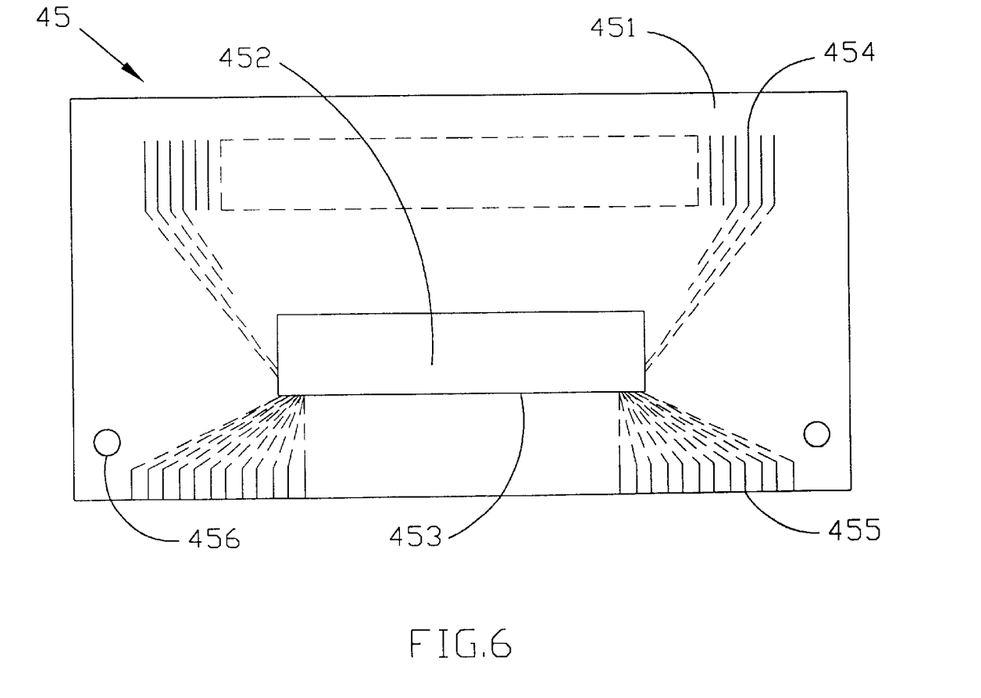
FIG. 6 is a schematic view of a LCD driver tape carrier package of the present invention.

The tape carrier package 45 for a LCD driver is disposed under the holding plate 43. FIG. 6 is a schematic top view of the tape carrier package 45. The tape carrier package 45 includes a tape carrier 451 and an LCD driver chip 452. The tape carrier 451 is formed of an insulating film, such as polyimide film, including a chip mounting site 453 for mounting the LCD driver chip 452, a plurality of input leads 454 formed along one side of the taper carrier 451 far from the chip mounting site 453, a plurality of output leads 455 formed along the other side thereof near the chip mounting site 453 and corresponding with the slot 431 of the holding plate 43, and at least one pair of the third guide holes 456 between the chip mounting site 453 and the output leads 455 for receiving the guide pieces 411. The pitches of the input leads 454 and the output leads 455 are larger than that of the conductive portions of the conductive member 44 so that each output lead 455 is capable of electrically connecting with one conductive terminal 422 of the print circuit board 42 via the conductive portions of the conductive member 44. The pitch of both of the input leads 454 and output leads 455 is about 0.3 mm.

The base plate 46 is used for supporting the tape carrier package 45. The base plate 46 has a recess portion 461 for placing the tape carrier package 45 therein, at least one pair of fourth guide holes 462 formed in the recess portion 461 for receiving the guide pieces 411, and a plurality of fourth through holes 463, for example thread holes, on opposite sides of the recess portion 461 and in alignment with the third through holes 433 of the holding plate 43. A groove 464 is formed in the recess portion 461 between the fourth guide holes 462 and matching with the chip mounting site 453 of the tape carrier package 45. The groove 464 makes the tape carrier package 45 more steadily placed in the recess portion 461 of the base plate 46.

A plurality of fasteners (not shown), for example screws, pass through the first through holes 412, the second through holes 423, the third through holes 433 and the fourth through holes 463, so as to fasten the mounting structure 40. Moreover, the guide pieces 411 of the upper plate 41 facilitate alignment between the upper plate 41, the print circuit board 42, the holding plate 43, the tape carrier package 45 and the base plate 46.

In accordance with the mounting structure 40, an improved electrical connection between the LCD driver tape carrier package 45 and the print circuit board 42 is obtained. The output leads 455 of the LCD driver tape carrier package 45 can electrically couple to external terminals via the conductive terminals 422 of the print circuit board 42. Hence, the LCD driver tape carrier package 45 advantageously performs failure analysis via the print circuit board 42. Moreover, the mounting structure 40 can repetitiously perform failure analysis for the LCD driver tape carrier package 45 via the print circuit board 42 without damaging the output leads 455 of the LCD driver tape carrier package 45. Besides, the mounting structure 40 of the LCD driver tape carrier package 45 with the print circuit board 42 is suitable for performing failure analysis with the following implements, such as emission microscope for multiplayer inspection (EMMI), electron-beam prober, and infra-red optical beam induced resistance change (IR-Obirch) etc.

The embodiments are only used to illustrate the present invention, not intended to limit the scope thereof. Many modifications of the embodiments can be made without departing from the spirit of the present invention.

What is claimed is:

1. A mounting structure of a tape carrier package with a circuit board, comprising:

a circuit board having a plurality of conductive terminals formed on a surface and a first opening formed along one side of said circuit board and adjacent to said conductive terminals;

a holding plate disposed under the surface of said circuit board having said conductive terminals formed thereon, said holding plate having a second opening matched with said first opening and a slot formed in a position thereof corresponding to said conductive terminals;

a conductive member disposed in said slot of said holding plate, said conductive member having a plurality of conductive portions formed thereon for electrically connecting with said respective conductive terminals, and the pitch of said conductive portions smaller than that of said conductive terminals;

a tape carrier package for a LCD driver disposed under said holding plate, said tape carrier package including a tape carrier and an LCD driver chip, said tape carrier having a chip mounting site for mounting said LCD driver chip, a plurality of input leads formed along one side of said tape carrier far from said chip mounting site, and a plurality of output leads formed along the other side thereof near said chip mounting site and corresponding with said slot of said holding plate, and the pitch of said output leads larger than that of said conductive portions of said conductive member so that each said output lead electrically connects with one said conductive terminal of said circuit board through said conductive portions; and a base plate for supporting said tape carrier package, said base plate having a recess portion for placing said tape carrier package therein.

2. The mounting structure of claim 1, wherein said circuit board further comprises at least one pair of first guide holes on opposite sides of said first opening, said holding plate further comprises at least one pair of second guide holes on opposite sides of said second opening and in alignment with said first guide holes, said tape carrier package further comprises at least one pair of third guide holes between said chip mounting site and said output leads, and in alignment with said second guide holes, and said base plate further comprises at least one pair of fourth guide holes in said recess portion and in alignment with said third guide holes.

3. The mounting structure of claim 2, wherein further comprising a pair of guide pins passing through said first guide holes, said second guide holes, said third guide holes and said fourth guide holes so that said circuit board, said holding plate, said tape carrier package and said base plate align with each other.

4. The mounting structure of claim 1, wherein said circuit board further comprises a plurality of first through holes on opposite sides of said first opening, said holding plate further comprises a plurality of second through holes on opposite sides of said second opening and in alignment with said first through holes, and said base plate further comprises a plurality of third through holes on opposite sides of said recess portion and in alignment with said second through holes.

5. The mounting structure of claim 4, further comprising a plurality of fasteners passing through said first through holes, said second through holes and said third through holes for fastening said mounting structure.

6. The mounting structure of claim 1, wherein said base plate further comprises a groove in said recess portion matched with said chip mounting site of said tape carrier package.

7. The mounting structure of claim 1, further comprising an upper plate disposed on said circuit board, said upper plate having a third opening matched with said first opening formed on one side thereof, at least one pair of guide pieces on opposite sides of said third opening, extending from the surface of said upper plate opposite to said circuit board and passing through said first guide holes, said second guide holes, said third guide holes and said fourth guide holes.

8. The mounting structure of claim 1, wherein said circuit board is a print circuit board.

9. The mounting structure of claim 1, wherein said conductive member is a flexible member having conductive filaments formed thereon.

10. The mounting structure of claim 9, wherein said conductive member is a silicon rubber having gold-plated filaments formed thereon.

11. A mounting structure of a tape carrier package with a print circuit board, comprising:

an upper plate having a first opening formed on one side thereof and at least one pair of guide pieces on opposite sides of said first opening and outwardly extending from a surface of said upper plate;

a print circuit board disposed under the surface of said upper plate having said guide pieces, said print circuit board having a second opening formed on one side thereof and matched with said first opening, at least one pair of first guide holes for receiving said guide pieces, and a plurality of conductive terminals along one side of said second opening between said first guide holes and on the surface of said print circuit board not contacting with said upper plate;

a holding plate disposed under the surface of said print circuit board having said conductive terminals formed thereon, said holding plate having a third opening matched with said second opening, a slot formed in a position thereof corresponding to said conductive terminals and at least one pair of second guide holes on opposite sides of said third opening for receiving said guide pieces;

a conductive member disposed in said slot of said holding plate, said conductive member having a plurality of conductive portions formed thereon for electrically connecting with said respective conductive terminals, and the pitch of said conductive portions smaller than that of said conductive terminals;

a tape carrier package for a LCD driver disposed under said holding plate, said tape carrier package including a tape carrier and an LCD driver chip, said tape carrier having a chip mounting site for mounting said LCD driver chip, a plurality of input leads formed along one side of said taper carrier far from said chip mounting site, and a plurality of output leads formed along the other side thereof near said chip mounting site and corresponding with said slot of said holding plate, the pitch of said output leads larger than that of said conductive portions of said conductive member so that each said output lead electrically connects with one said conductive terminal of said print circuit board through said conductive portions, and at least one pair of said third guide holes between said chip mounting site and said output leads for receiving said guide pieces; and a base plate for supporting said tape carrier package, said base plate having a recess portion for placing said tape carrier package therein and at least one pair of fourth guide holes formed in said recess portion for receiving said guide pieces.

12. The mounting structure of claim 11, wherein said base plate further comprises a groove matched with said chip mounting site formed in said recess portion.

13. The mounting structure of claim 11, wherein said conductive member is a flexible member having conductive filaments formed thereon.

14. The mounting structure of claim 13, wherein said conductive member is a flexible member having gold-plated filaments formed thereon.

15. The mounting structure of claim 11, wherein said upper plate further comprises a plurality of first through holes on opposite sides of said first opening, said circuit board further comprises a plurality of second through holes on opposite sides of said second opening and in alignment with said first through holes, said holding plate further comprises a plurality of third through holes on opposite sides of said third opening and in alignment with said second through holes, and said base plate further comprises a plurality of fourth through holes on opposite sides of said recess portion and in alignment with said third through holes.

16. The mounting structure of claim 15, wherein further comprising a plurality of fasteners passing through said first through holes, said second through holes, said third through holes and said fourth through holes for fastening said mounting structure.

17. A use of the mounting structure of claim 11, wherein said mounting structure is suitable for performing failure analysis for said LCD driver chip with the implement of emission microscope for multiplayer inspection.

18. A use of the mounting structure of claim 11, wherein said mounting structure is suitable for performing failure analysis for said LCD driver chip with the implement of electron-beam prober.

19. A use of the mounting structure of claim 11, wherein said mounting structure is suitable for performing failure analysis for said LCD driver chip with the implement of infra-red optical beam induced resistance change.

* * * * *